United States Patent
Yu et al.

(10) Patent No.: US 11,497,109 B2
(45) Date of Patent: Nov. 8, 2022

(54) EUV LIGHT CONCENTRATING APPARATUS AND LITHOGRAPHY APPARATUS INCLUDING THE SAME

(71) Applicant: Samsung Electronics Co., Ltd., Suwon-si (KR)

(72) Inventors: Ho Yu, Pohang-si (KR); Chae-mook Lim, Yongin-si (KR); Sung-ho Jang, Hwaseong-si (KR); Min-seok Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/158,380

(22) Filed: Jan. 26, 2021

(65) Prior Publication Data

US 2021/0153333 A1    May 20, 2021

Related U.S. Application Data

(62) Division of application No. 16/530,191, filed on Aug. 2, 2019, now abandoned.

(30) Foreign Application Priority Data

Nov. 6, 2018    (KR) ........................ 10-2018-0135329

(51) Int. Cl.
*H05G 2/00*    (2006.01)
*G03F 7/20*    (2006.01)
*H01S 3/223*    (2006.01)

(52) U.S. Cl.
CPC ......... *H05G 2/006* (2013.01); *G03F 7/70033* (2013.01); *H05G 2/005* (2013.01); *H05G 2/008* (2013.01); *H01S 3/2232* (2013.01)

(58) Field of Classification Search
CPC . G03F 7/70033; G03F 7/70916; H05G 2/005; H05G 2/006; H05G 2/008
See application file for complete search history.

(56) References Cited

U.S. PATENT DOCUMENTS

| | | |
|---|---|---|
| 6,881,971 B2 | 4/2005 | Ahmad |
| 7,196,342 B2 | 3/2007 | Ershov et al. |
| 8,477,285 B2 | 7/2013 | Ehm et al. |
| 8,872,142 B2 | 10/2014 | Nagai et al. |
| 8,885,141 B2 | 11/2014 | Singer et al. |
| 9,544,985 B2 | 1/2017 | Heo et al. |
| 9,665,007 B2 * | 5/2017 | Chien ................... G03F 7/7015 |
| 9,795,023 B2 | 10/2017 | Ershov et al. |
| 9,857,690 B2 * | 1/2018 | Kim .................... G03F 7/70916 |
| 9,888,554 B2 | 2/2018 | Baek et al. |

(Continued)

FOREIGN PATENT DOCUMENTS

| | | |
|---|---|---|
| JP | 2013-004369 A | 1/2013 |
| JP | 5175626 B2 | 4/2013 |

*Primary Examiner* — Wyatt A Stoffa
(74) *Attorney, Agent, or Firm* — Harness, Dickey & Pierce, P.L.C.

(57) ABSTRACT

An extreme ultraviolet (EUV) light concentrating apparatus including a main body having a concave inner portion and configured to rotate, a tin generator configured to generate tin drops and spray the tin drops, a tin catcher configured to process the sprayed tin drops, a protective cover configured to block the tin drops from falling into the main body, and a rotation guide configured to rotate the main body may be provided.

16 Claims, 20 Drawing Sheets

(56) References Cited

U.S. PATENT DOCUMENTS

| | | | |
|---|---|---|---|
| 9,989,758 B2* | 6/2018 | Kuritsyn | H05G 2/003 |
| 10,495,974 B2* | 12/2019 | Tsai | H05G 2/006 |
| 10,880,981 B2* | 12/2020 | Chien | G03F 7/70983 |
| 2011/0248191 A1* | 10/2011 | Fomenkov | H05G 2/006 |
| | | | 250/504 R |
| 2014/0078480 A1* | 3/2014 | Park | G03F 7/70916 |
| | | | 250/504 R |
| 2014/0319387 A1* | 10/2014 | Kim | H05G 2/008 |
| | | | 250/504 R |
| 2017/0215265 A1* | 7/2017 | Baek | G02B 27/0006 |
| 2018/0314145 A1* | 11/2018 | Chang | H05G 2/008 |
| 2019/0079401 A1* | 3/2019 | Tsai | G03F 7/2004 |
| 2019/0104604 A1* | 4/2019 | Chien | G03F 7/70958 |
| 2019/0200442 A1* | 6/2019 | Ershov | G03F 7/70033 |
| 2020/0008290 A1* | 1/2020 | Su | H05G 2/00 |
| 2020/0026179 A1* | 1/2020 | Chang | G03F 7/70033 |
| 2020/0107426 A1* | 4/2020 | Cheng | H05G 2/005 |

\* cited by examiner

XIB-XIB'

EUV LIGHT CONCENTRATING APPARATUS AND LITHOGRAPHY APPARATUS INCLUDING THE SAME

CROSS-REFERENCE TO RELATED APPLICATION

This application is divisional of U.S. application Ser. No. 16/530,191, filed on Aug. 2, 2019, which claims the benefit of Korean Patent Application No. 10-2018-0135329, filed on Nov. 6, 2018, in the Korean Intellectual Property Office, the disclosure of each of which is incorporated herein in its entirety by reference.

BACKGROUND

The inventive concepts relate to extreme ultraviolet (EUV) light concentrating apparatuses or lithography apparatuses including the EUV light concentrating apparatuses, and more particularly, to EUV light concentrating apparatuses used in a photolithography process or lithography apparatuses including the EUV light concentrating apparatuses.

To realize a high integration density of semiconductor devices on a limited area of a wafer, a photolithography process may be performed using EUV light. The EUV light may be generated due to plasma, which is generated by exposing carbon dioxide laser light to fine tin drops. In this case, some of the tin drops that cannot be converted into plasma may contaminate an inner surface of an EUV light concentrating apparatus.

SUMMARY

The inventive concepts provide extreme ultraviolet (EUV) light concentrating apparatuses configured to efficiently clean an inner surface of the EUV light concentrating apparatus.

The inventive concepts also provide lithography apparatus including an EUV light concentrating apparatuses configured to perform an improved photolithography process using EUV light having increased reflectance.

According to an aspect of the inventive concepts, an EUV light concentrating apparatus includes a main body having a concave inner portion and configured to rotate, a tin generator configured to generate tin drops and spray the tin drops, a tin catcher configured to process the sprayed tin drops, a protective cover configured to block the tin drops from falling into the main body, and a rotation guide configured to rotate the main body.

According to another aspect of the inventive concepts, a lithography apparatus includes a source unit configured to emit carbon dioxide laser light, an EUV light concentrating apparatus configured to expose tin drops to the carbon dioxide laser light, generate extreme ultraviolet (EUV) light, and concentrate the EUV light, and a wing unit configured to provide a path through which the EUV light travels. The EUV light concentrating apparatus may include a main body having a concave inner portion and configured to rotate, a tin generator configured to generate the tin drops and spray the tin drops, a tin catcher configured to process the sprayed tin drops, a protective cover configured to block the tin drops from falling into the main body. The lithography apparatus may include a nozzle frame configured to spray gas to an inner surface of the main body and suck contaminants on the inner surface of the main body, and a rotation guide configured to rotate the main body. The wing unit may include a blocking film configured to block the carbon dioxide laser light from escaping to the outside. When the lithography apparatus is viewed from above, the blocking film, the protective cover, and the nozzle frame may at least partially overlap each other.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, embodiments will be described in detail with reference to the accompanying drawings.

Figure 1:
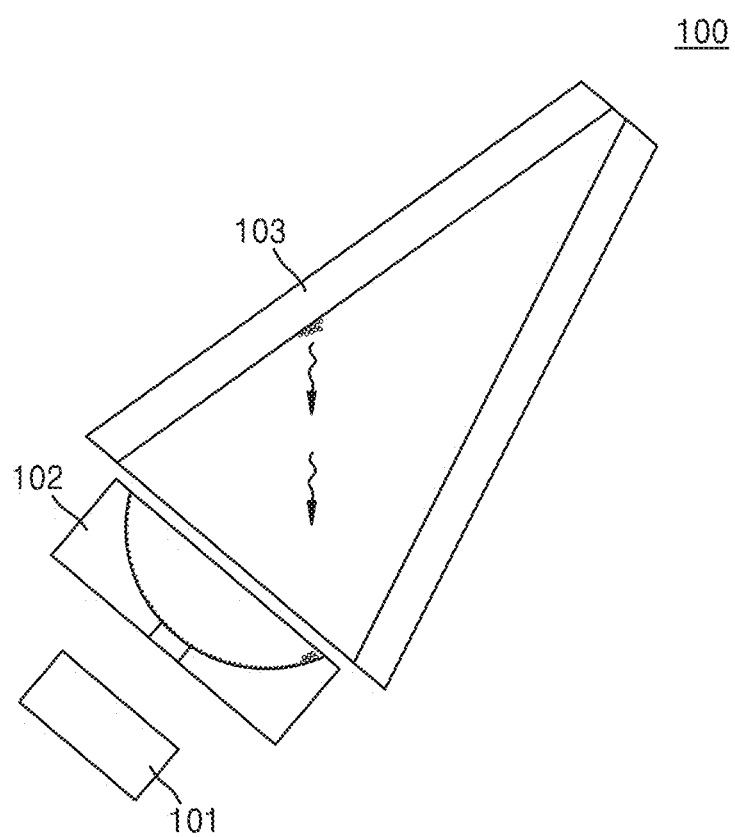
FIG. 1 is a cross-sectional view showing the inside of a lithography apparatus.

FIG. 1 is a cross-sectional view showing the inside of a lithography apparatus 100.

Referring to FIG. 1, the lithography apparatus 100 may include a source unit 101, an extreme ultraviolet (EUV) light concentrating apparatus 102, and a wing unit 103.

The source unit 101 may emit carbon dioxide ($CO_2$) laser light into the lithography apparatus 100.

The EUV light concentrating apparatus 102 may generate tin drops and expose the generated tin drops to the carbon dioxide laser light emitted by the source unit 101. When the tin drops are exposed to the carbon dioxide laser light, the tin drops may be put into a plasma state. EUV light may be generated during the process of putting the tin drops into the plasma state. The generated EUV light may have a wavelength of about 13.5 nanometers (nm).

Also, the EUV light concentrating apparatus 102 may concentrate the generated EUV light and transmit the concentrated EUV light to a scanner.

The wing unit 103 may provide a path through which the concentrated EUV light may travel. The path may have a structure that narrows toward an upper portion thereof. Also, the wing unit 103 may be combined with an upper portion of the EUV light concentrating apparatus 102.

When fine tin drops generated by the EUV light concentrating apparatus 102 are put into a plasma state, the EUV light may be generated to leave tin residues having various sizes, such as ions, atoms, molecules, and/or particle lumps.

Tin residues (e.g., the ions, the atoms, and/or the molecules) having relatively small sizes may be deposited on an inner surface of the EUV light concentrating apparatus 102. The tin residues having the relatively small sizes may be deposited to a relatively uniform thickness on a surface of the EUV light concentrating apparatus 102.

A tin residue (e.g., the particle lump) having a relatively small size may be deposited on an inner surface of the wing unit 103 of the EUV light concentrating apparatus 102. The tin residue deposited on the inner surface of the wing unit 103 may be separated from the inner surface of the wing unit 103 over time and deposited on the inner surface of the EUV light concentrating apparatus 102. Also, the tin residue deposited on the inner surface of the wing unit 103 may react with the EUV light and partially contaminate the inner surface of the EUV light concentrating apparatus 102.

Figure 2:
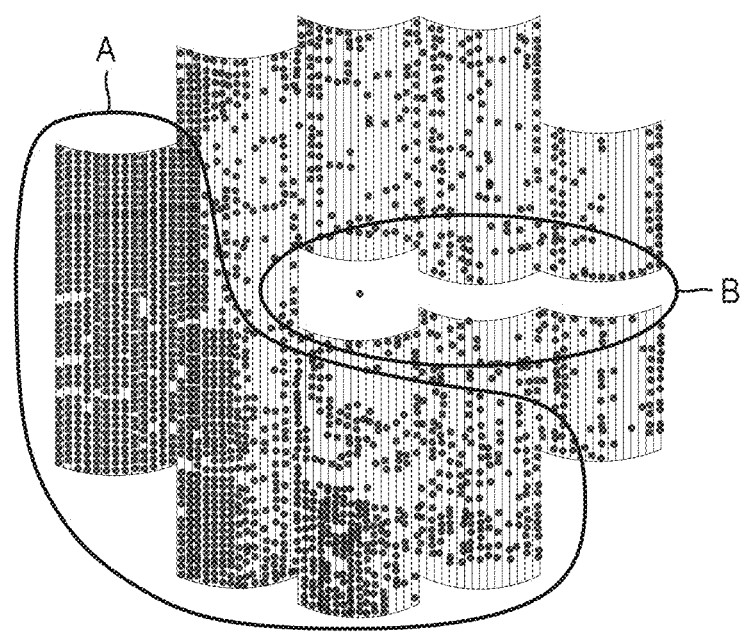
FIG. 2 shows an image of extreme ultraviolet (EUV) light reflected by an EUV light concentrating apparatus shown in FIG. 1.

FIG. 2 shows an image of EUV light, which is reflected by the EUV light concentrating apparatus 102 shown in FIG. 1.

FIG. 2 confirms that the above-described tin residue is partially deposited on a surface of the EUV light concentrating apparatus 102. More specifically, the tin residue may be concentrated and deposited on an edge A of an inner surface of the EUV light concentrating apparatus 102. The tin residue concentrated and deposited on the edge A may not only contaminate the surface of the EUV light concentrating apparatus 102, but also reduce a reflectance of the EUV light on the EUV light concentrating apparatus 102. Thus, the quality of the EUV light concentrated on the EUV light concentrating apparatus 102 may be degraded.

Figure 3:
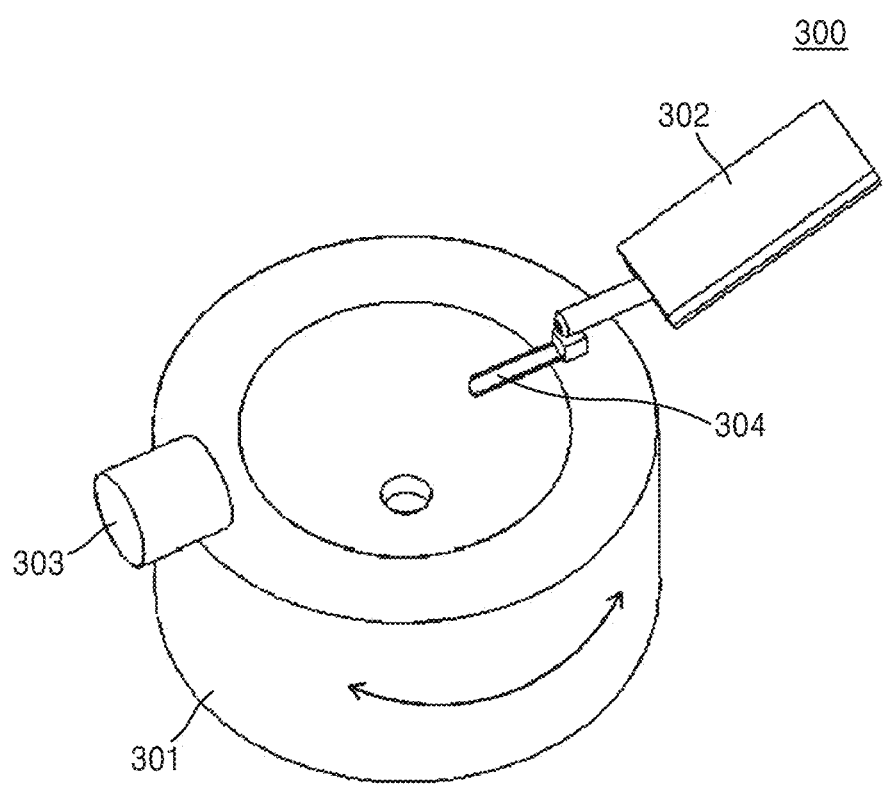
FIGS. 3 and 4 are three-dimensional (3D) views of an EUV light concentrating apparatus according to an example embodiment.
Figure 4:
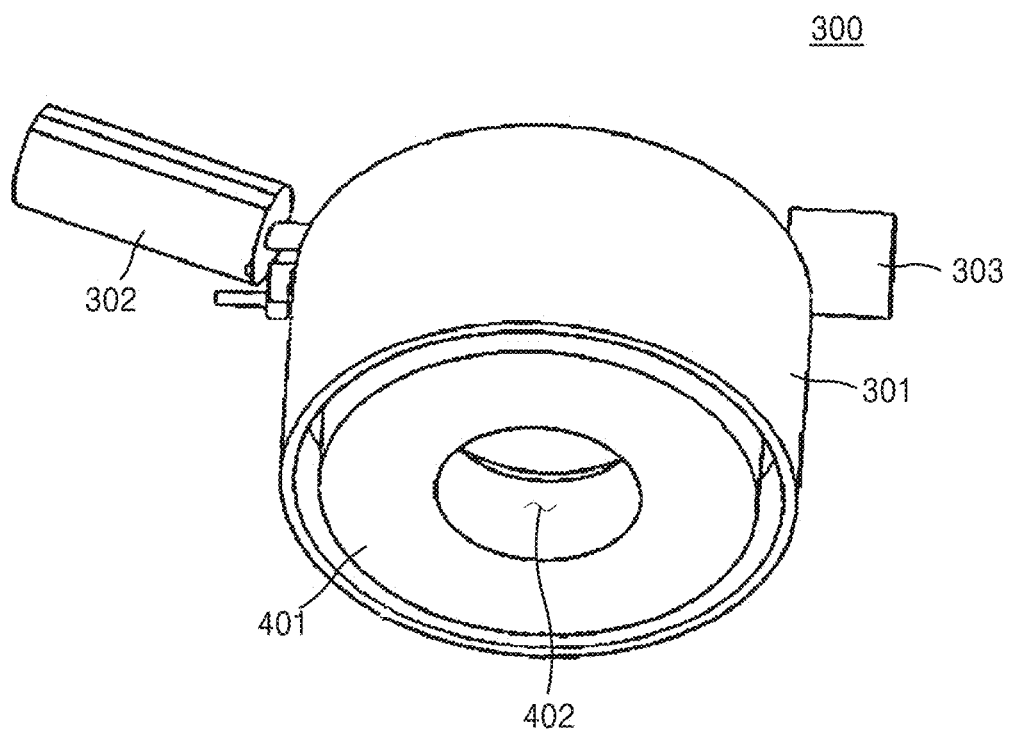
Figure 5:
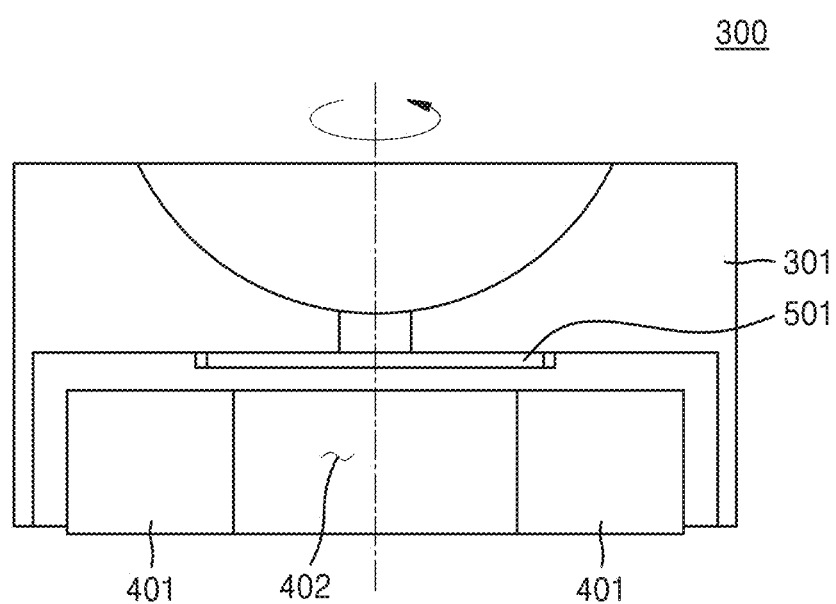
FIG. 5 is a view showing an inner cross-section of the EUV light concentrating apparatus shown in FIGS. 3 and 4.

FIGS. 3 and 4 are three-dimensional (3D) views of an EUV light concentrating apparatus 300 according to an example embodiment, and FIG. 5 is a view showing an inner cross-section of the EUV light concentrating apparatus 300 shown in FIGS. 3 and 4.

Referring to FIGS. 3 to 5, the EUV light concentrating apparatus 300 may include a main body 301, a tin generator 302, a tin catcher 303, a protective cover 304, a fixed frame 401, and a rotation guide 501.

The inside of the main body 301 of the EUV light concentrating apparatus 300 may have a concave shape. EUV light generated on the EUV light concentrating apparatus 300 may be concentrated due to a concave inner shape of the main body 301. The main body 301 of the EUV light concentrating apparatus 300 according to the present example embodiment may rotate about a central axis of the main body 301. More specifically, the main body 301 may rotate by 360° about the central axis. However, the inventive concepts are not limited thereto, and the main body 301 may rotate by 180° about the central axis in a first direction or rotate by 180° about the central axis in a second direction that is opposite to the first direction.

Further, a cavity 402 may be formed in the main body 301. The carbon dioxide laser light emitted by the source unit 101 may pass through the cavity 402 formed in the main body 301 and provided on the EUV light concentrating apparatus 300.

The tin generator 302 may generate tin drops and spray the generated tin drops toward the tin catcher 303. As described above, the sprayed tin drops may be exposed to carbon dioxide laser light and put into a plasma state to generate EUV light.

The tin catcher 303 may process the tin drops sprayed by the tin generator 302. The tin catcher 303 may be located in a direction opposite to the tin generator 302.

The protective cover 304 may block or prevent the tin drops generated by the tin generator 302 from falling on an inner surface of the main body 301 of the EUV light concentrating apparatus 300 and protect the inner surface of the main body 301. The protective cover 304 may be located under the tin generator 302.

The fixed frame 401 may provide a frame such that the EUV light concentrating apparatus 300 is installed in connection with another lithography apparatus. The fixed frame 401 may be located under the main body 301. The cavity 402 may be formed in the center of the fixed frame 401. Carbon dioxide laser light may be provided by the source unit 101 through the cavity 402 to the EUV light concentrating apparatus 300.

A rotation guide 501 may be provided over the fixed frame 401. The rotation guide 501 may be connected to a motor and rotate the main body 301. The rotation guide 501 may rotate the main body 301 in various other ways. For example, the rotation guide 501 may rotate the main body 301 using electromagnetic force. Parameters (e.g., a rotation speed and direction of the rotation guide 501) may be flexibly adjusted by a controller electrically connected to the rotation guide 501.

By rotating the main body 301 of the EUV light concentrating apparatus 300 due to the rotation guide 501, tin residues may not be partially deposited in the EUV light concentrating apparatus 300 but uniformly deposited on an inner surface of the main body 301. Accordingly, a reduction in reflectance of EUV light concentrated on the EUV light concentrating apparatus 300 may be lessened, thereby improving the quality of the concentrated EUV light.

Figure 6:
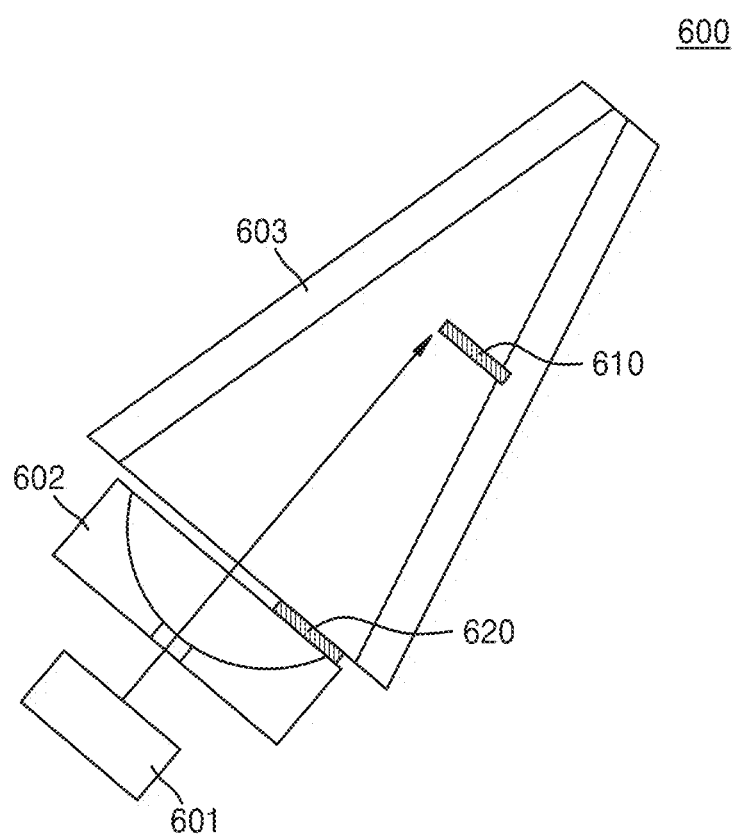
FIG. 6 is a cross-sectional view showing the inside of a lithography apparatus according to an example embodiment.

FIG. 6 is a cross-sectional view showing the inside of a lithography apparatus 600 according to an example embodiment.

Referring to FIG. 6, the lithography apparatus 600 may include a source unit 601, an EUV light concentrating apparatus 602, and a wing unit 603.

Because components included in the source unit 601, the EUV light concentrating apparatus 602, and the wing unit 603 are the same as or substantially similar to those described with reference to FIGS. 1 to 5, a detailed description thereof will be omitted.

The wing unit 603 of the lithography apparatus 600 may include a blocking film 610. The blocking film 610 may be installed near the inner middle of the wing unit 603. The blocking film 610 may block desired (or, alternatively predetermined) part of carbon dioxide laser light provided on the lithography apparatus 600 so that the carbon dioxide laser light cannot escape to the outside. The wing unit 603 including the blocking film 610 may affect a reflected image of EUV light, which is generated on the EUV light concentrating apparatus 602. More specifically, referring to FIG. 2, the EUV light may be absent on a desired (or, alternatively a predetermined) region B of FIG. 2 due to the wing unit 603 including the blocking film 610.

To minimize an area of the region B of FIG. 2, in which the EUV light is absent, when the lithography apparatus 600 is viewed from above, the blocking film 610 of the wing unit 603 may overlap a protective cover 620 of the EUV light concentrating apparatus 602. In other words, when the lithography apparatus 600 is viewed from above, a desired (or, alternatively a predetermined) portion of the protective cover 620 may be covered by the blocking film 610 and may not be seen.

Figure 7:
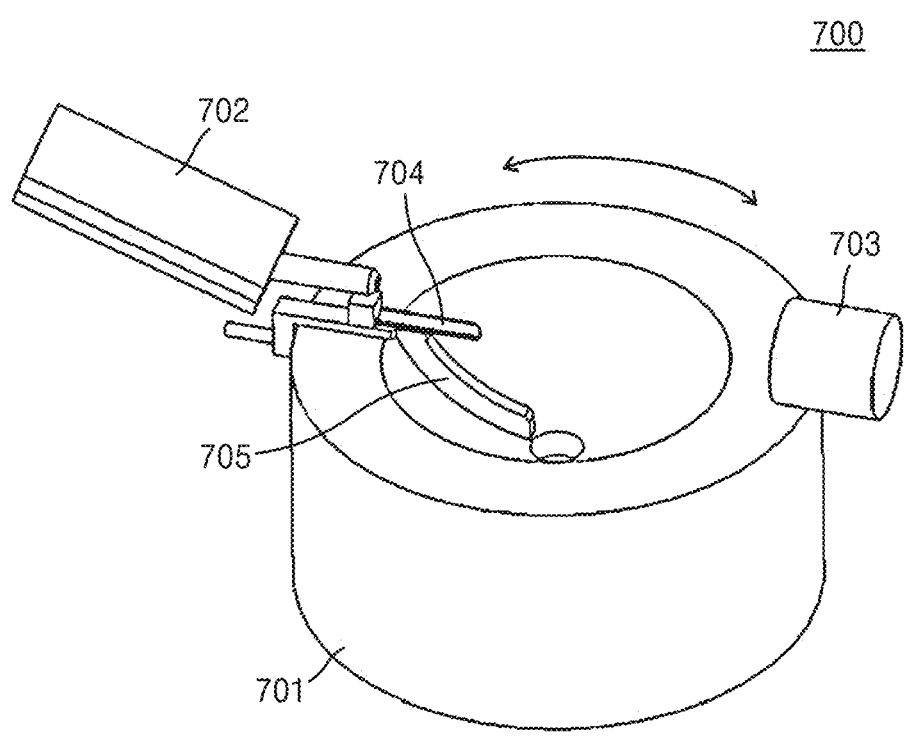
FIG. 7 is a 3D view of an EUV light concentrating apparatus according to an example embodiment.
Figure 8:
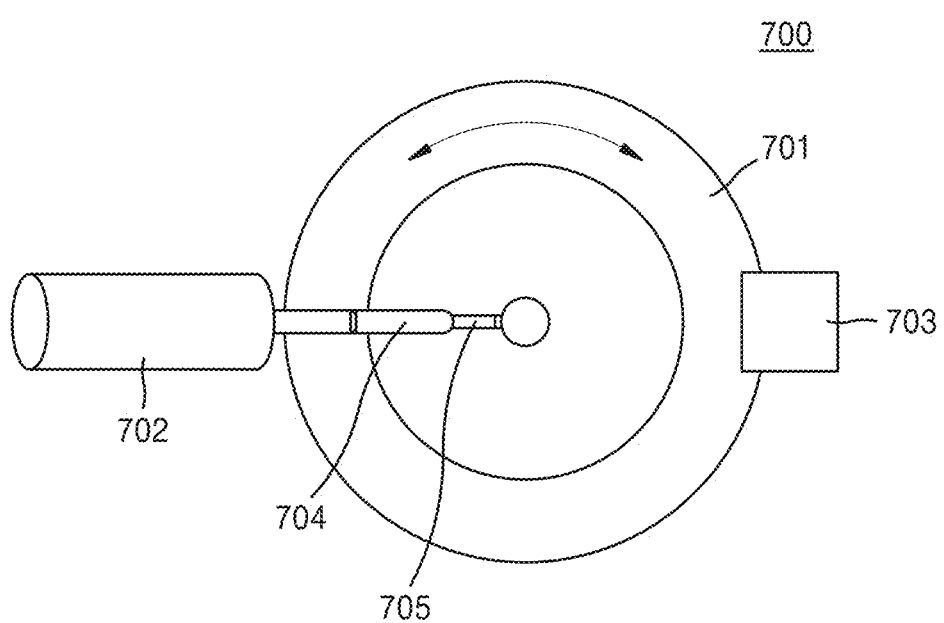
FIG. 8 is a plan view of the EUV light concentrating apparatus shown in FIG. 7.
Figure 9A:
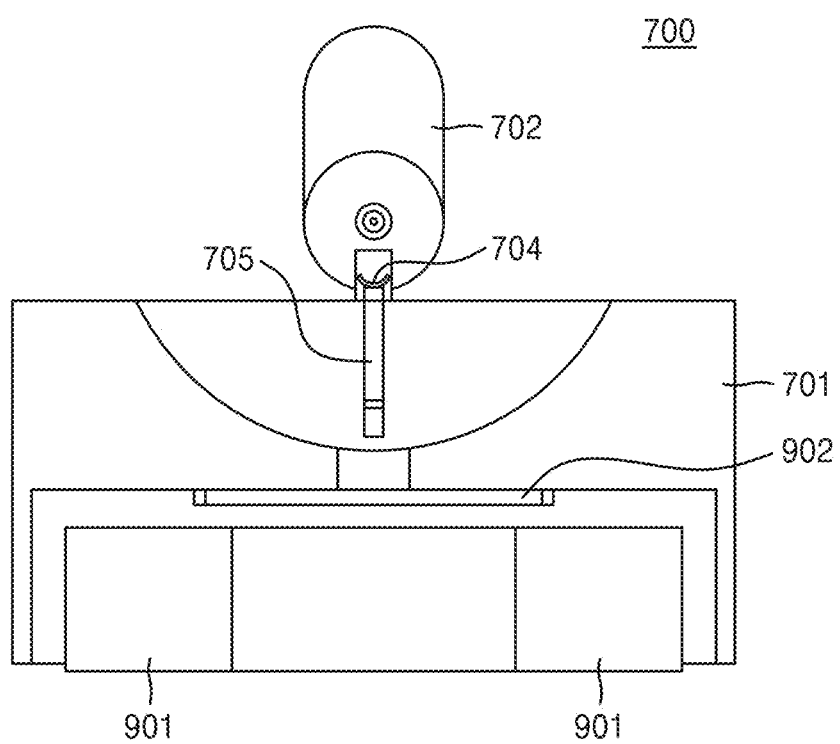
FIGS. 9A and 9B are internal cross-sectional views of the EUV light concentrating apparatus shown in FIG. 7.
Figure 9B:
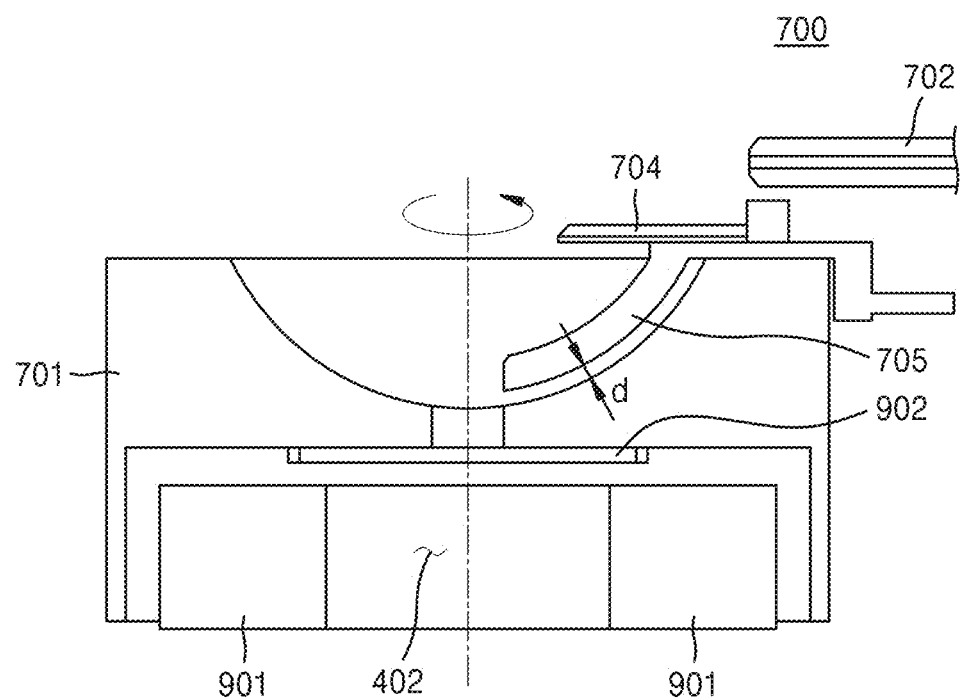
Figure 10:
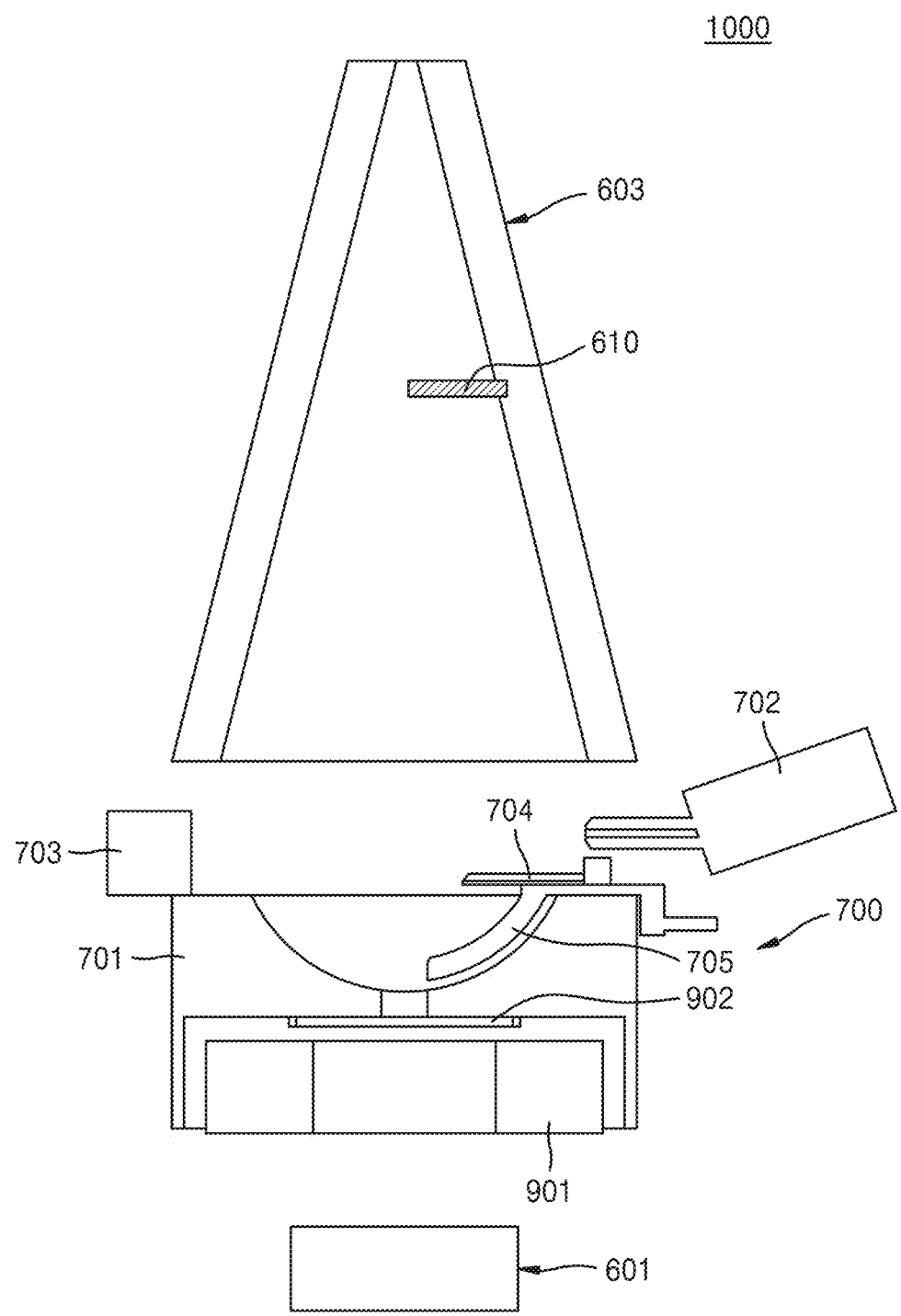
FIG. 10 is an internal cross-sectional view of a lithography apparatus including the EUV light concentrating apparatus shown in FIG. 7.

FIGS. 7 to 10 are views illustrating an EUV light concentrating apparatus 700 and a lithography apparatus 100 including the EUV light concentrating apparatus 700, according to an example embodiment. More specifically, FIG. 7 is a 3D view of the EUV light concentrating apparatus 700. FIG. 8 is a plan view of the EUV light concentrating apparatus 700. FIGS. 9A and 9B are internal cross-sectional views of the EUV light concentrating apparatus 700. FIG. 10 is an internal cross-sectional view of the lithography apparatus 1000 including the EUV light concentrating apparatus 700.

Referring to FIGS. 7 to 9B, the EUV light concentrating apparatus 700 may include a main body 701, a tin generator 702, a tin catcher 703, a protective cover 704, a fixed frame 901, and a rotation guide 902. Because components of the EUV light concentrating apparatus 700 are the same as or substantially similar to those described with reference to FIGS. 2 to 5, a detailed description thereof will be omitted.

The EUV light concentrating apparatus 700 according to the present example embodiment may further include a nozzle frame 705. The nozzle frame 705 may be located under the protective cover 704. More specifically, when the EUV light concentrating apparatus 700 is viewed from above, the nozzle frame 705 may overlap the protective cover 704 so that a portion of the nozzle frame 705 is covered by the protective cover 704.

Further, an outer shape of the nozzle frame 705 may include a curved surface having the same shape as or substantially similar shape to an inner surface of the main body 701 of the EUV light concentrating apparatus 700. In other words, an outer shape of the nozzle frame 705 may include a curved surface following the shape of an inner surface of the main body 701 of the EUV light concentrating apparatus 700. Accordingly, the nozzle frame 705 and the main body 701 may be located close to each other as shown in FIG. 9B. The nozzle frame 705 may be spaced a desired (or, alternatively a predetermined) distance 'd' apart from the inner surface of the main body 701. The distance 'd' between the nozzle frame 705 and the inner surface of the main body 701 may be flexibly changed according to operator's needs.

The nozzle frame 705 may include a spray unit (not shown) and a suction unit (not shown). The spray unit may spray gas to an inner surface of the EUV light concentrating apparatus 700, while the suction unit may suck contaminants on the inner surface of the EUV light concentrating apparatus 700.

While the tin generator 702, the tin catcher 703, and the fixed frame 901 of the EUV light concentrating apparatus 700 are fixed, the main body 701 may rotate to operate the spray unit and the suction unit of the nozzle frame 705 so that the inner surface of the EUV light concentrating apparatus 700 can be cleaned. The process of cleaning the inner surface of the EUV light concentrating apparatus 700 will be described in detail below.

Referring to FIG. 10, the lithography apparatus 1000 may include a source unit 601, an EUV light concentrating apparatus 700, and a wing unit 603. The source unit 601 and the wing unit 603 are the same as or substantially similar to those described with reference to FIG. 6.

When the lithography apparatus 1000 is viewed from above, a blocking film 610 of the wing unit 603 may overlap the protective cover 704 and the nozzle frame 705 of the EUV light concentrating apparatus 700. In other words, when the lithography apparatus 1000 is viewed from above, the nozzle frame 705 of the EUV light concentrating apparatus 700 may be covered by the blocking film 610 and the protective cover 704. Accordingly, the nozzle frame 705 may not affect EUV light concentrated on the EUV light concentrating apparatus 700.

A mechanical cleaning method using a nozzle frame 1100 according to an example embodiment will be described with reference to FIGS. 11A and 11B.

Figure 11A:
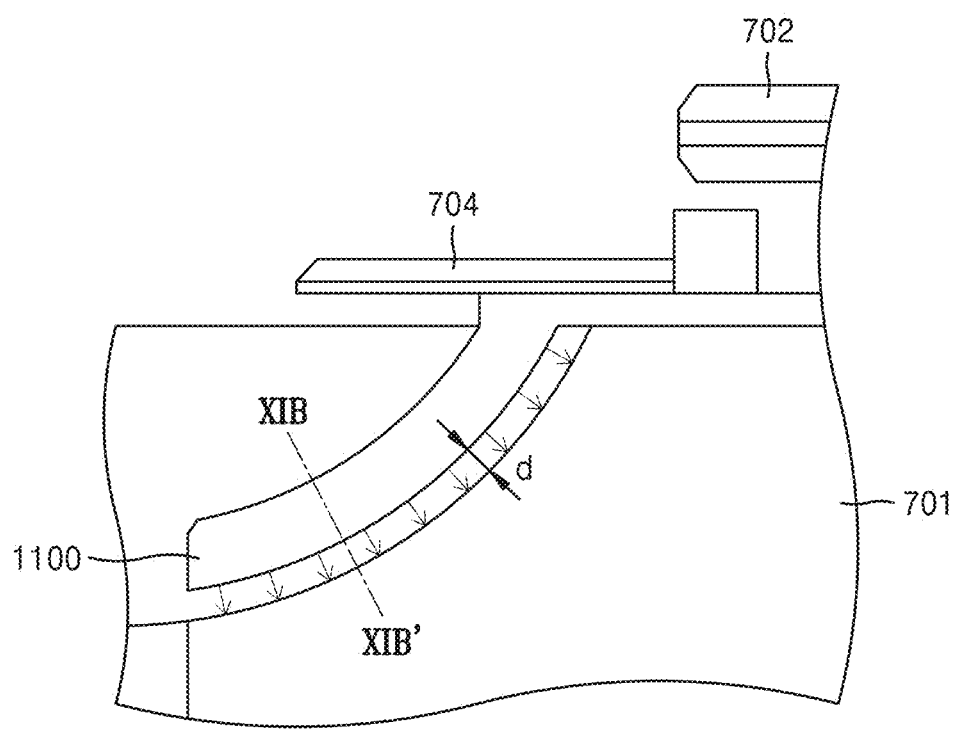
FIG. 11A is a view showing a shape of a nozzle frame according to an example embodiment.
Figure 11B:
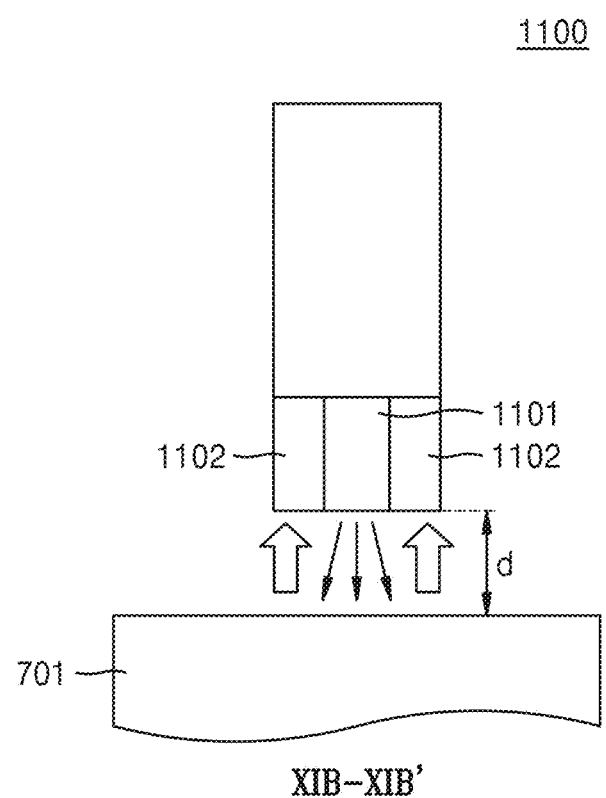
FIG. 11B is a cross-sectional view of the nozzle frame taken along line XIB-XIB' of FIG. 11A.

FIG. 11A is a view showing a shape of a nozzle frame 1100 according to an example embodiment, and FIG. 11B is a cross-sectional view of the nozzle frame 1100 taken along a line XIB-XIB' of FIG. 11A.

Referring to FIGS. 11A and 11B, a distance 'd' between the nozzle frame 1100 and an inner surface of a main body 701 of an EUV light concentrating apparatus may be appropriately adjusted according to operator's needs.

After the distance 'd' between the nozzle frame 1100 and the inner surface of the main body 701 of the EUV light concentrating apparatus is appropriately adjusted, a spray unit 1101 of the nozzle frame 1100 may spray gas of a high pressure to the inner surface of the main body 701 of the EUV light concentrating apparatus. The sprayed gas may be, for example, hydrogen gas. A direction in which the spray unit 1101 of the nozzle frame 1100 sprays the gas may be perpendicular to the inner surface of the main body 701 of the EUV light concentrating apparatus.

Contaminants stuck to the inner surface of the main body 701 of the EUV light concentrating apparatus may be separated from the inner surface of the main body 701 of the EUV light concentrating apparatus due to the sprayed gas of the high pressure. Also, the deposition of the contaminants on the inner surface of the main body 701 of the EUV light concentrating apparatus may be blocked or prevented due to the spayed gas of the high pressure.

The contaminants, which are separated from the inner surface of the main body 701 of the EUV light concentrating apparatus by the spray unit 1101, may be sucked by a suction unit 1102 of the nozzle frame 1100.

An electrical cleaning method using a nozzle frame 1200 according to an example embodiment will be described with reference to FIGS. 12A to 13.

Figure 12A:
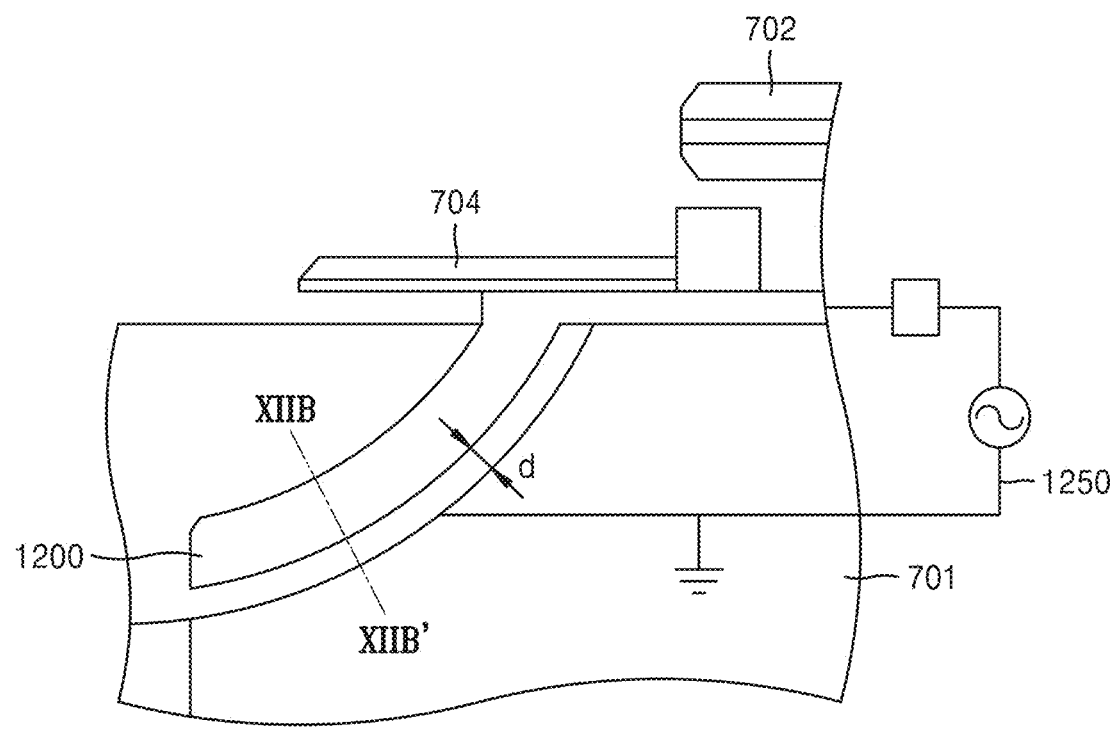
FIG. 12A is a view showing a shape of a nozzle frame according to an example embodiment.
Figure 12B:
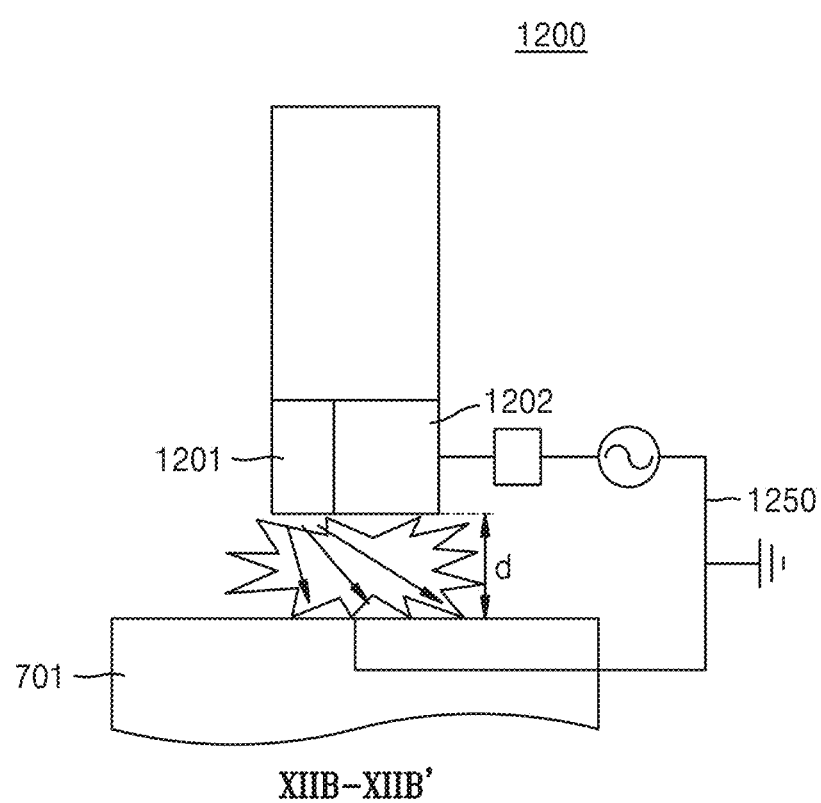
FIG. 12B is a cross-sectional view of the nozzle frame taken along line XIIB-XIIB' of FIG. 12A.

FIG. 12A is a view showing a shape of a nozzle frame 1200 according to an example embodiment, and FIG. 12B is a cross-sectional view of the nozzle frame 1200 taken along a line XIB-XIB' of FIG. 12A.

The nozzle frame 1200 according to the present example embodiment may generate plasma near an inner surface of a main body 701 of an EUV light concentrating apparatus. More specifically, the inner surface of the main body 701 of the EUV light concentrating apparatus may be electrically connected to the nozzle frame 1200 by an impedance matching network 1250.

Plasma containing a high concentration of hydrogen radicals may be generated near the inner surface of the main body 701 via the impedance matching network 1250. As described above, because a distance 'd' between the inner surface of the main body 701 and the nozzle frame 1200 may be appropriately adjusted according to operator's needs, plasma containing a uniform and high concentration of hydrogen radicals may be formed between the inner surface of the main body 701 and the nozzle frame 1200. The plasma containing the high concentration of the hydrogen radicals may increase an etching rate of a contaminant (e.g., a tin contaminant) located on the inner surface of the main body 701 of the EUV light concentrating apparatus, thereby electrically removing the contaminant from the inner surface of the main body 701 of the EUV light concentrating apparatus more efficiently.

More specifically, referring to FIG. 12B, the nozzle frame 1200 may include a spray unit 1201 and an electrode unit 1202.

As described above, a spray unit 1201 of the nozzle frame 1200 may spray gas of a high pressure and remove the contaminant on the inner surface of the main body 701 of the EUV light concentrating apparatus.

While hydrogen gas is being supplied to a surface of the main body 701 of the EUV light concentrating apparatus, a large potential difference may periodically occur between the inner surface of the main body 701 and the electrode unit 1202 of the nozzle frame 1200 due to the impedance matching network 1250. In this case, plasma containing a high concentration of hydrogen radicals may be generated between the inner surface of the main body 701 and the electrode unit 1202 of the nozzle frame 1200.

Figure 13:
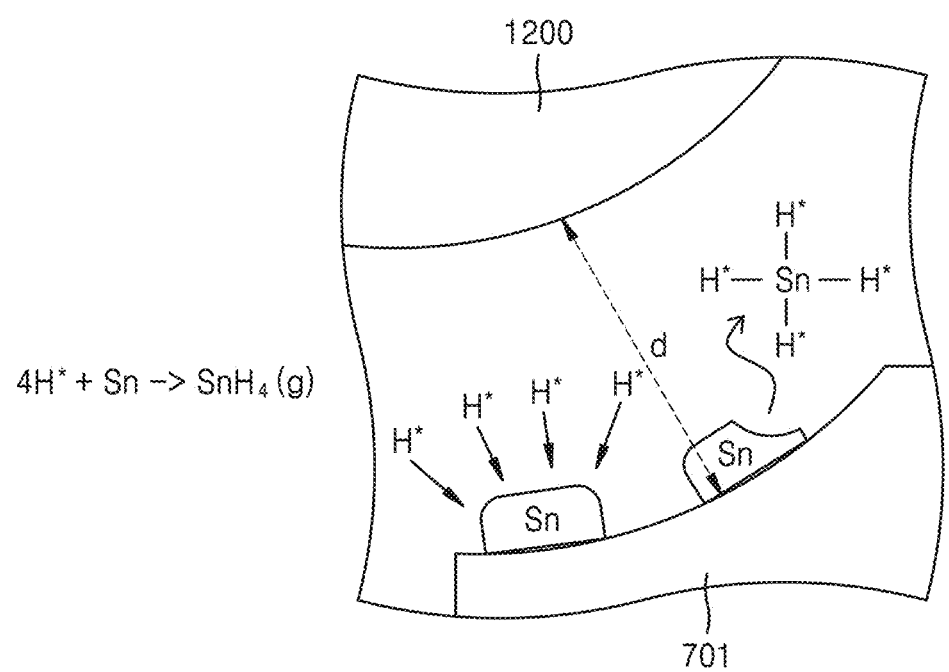
FIG. 13 is a view showing a mechanism for removing contaminants on an inner surface of a main body using an EUV light concentrating apparatus according to an example embodiment.

FIG. 13 is a view showing a mechanism for removing contaminants on an inner surface of a main body 701 using an EUV light concentrating apparatus according to an example embodiment.

Referring to FIG. 13, hydrogen radicals due to an electrode unit 1202 of a nozzle frame 1200 may cause a chemical reaction with a contaminant on an inner surface of the main body 701 of the EUV light concentrating apparatus. More specifically, the contaminant may be tin. As shown in FIG. 13, the hydrogen radicals may chemically react with tin to remove the contaminant from the inner surface of the main body 701 of the EUV light concentrating apparatus.

The nozzle frame 1200 according to the present example embodiment may generate plasma containing a high concentration of the hydrogen radicals at a close distance from the inner surface of the main body 701 of the EUV light concentrating apparatus so that the contaminant may be removed efficiently from the inner surface of the main body 701 of the EUV light concentrating apparatus.

Also, as described above, the EUV light concentrating apparatus may include not only the nozzle frame 1200 but also the main body 701 configured to be capable of rotating. Thus, the inner surface of the main body 701 of the EUV light concentrating apparatus may be optionally clearly cleaned. Thus, a reflectance of EUV light on the EUV light concentrating apparatus may increase.

Figure 14:
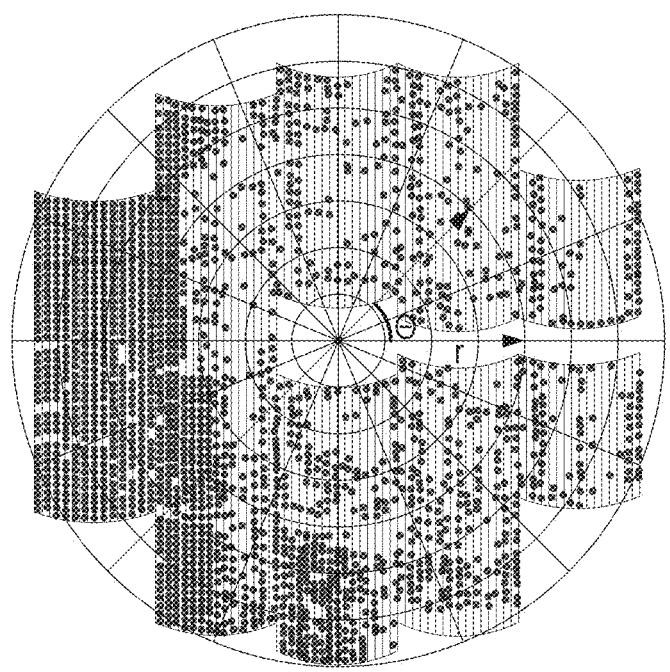
FIG. 14 is a view for explaining coordinates of an inner surface of an EUV light concentrating apparatus according to an example embodiment.

FIG. 14 is a view for explaining coordinates of an inner surface of an EUV light concentrating apparatus according to an example embodiment.

Referring to the image of EUV light reflected on the EUV light concentrating apparatus, which is described above with reference to FIG. 2, the above-described tin residue may be partially deposited on the inner surface of the EUV light concentrating apparatus. The tin residue non-uniformly deposited on the inner surface of the EUV light concentrating apparatus may cause non-uniform reflection of the EUV light. Accordingly, to easily clean the tin residue non-uniformly deposited on the inner surface of the EUV light concentrating apparatus, precise measurement of a position at which the tin residue is deposited may be important.

Therefore, a controller connected to the EUV light concentrating apparatus may precisely measure the position of the tin residue on the inner surface of the EUV light concentrating apparatus by using a coordinate system shown in FIG. 14. For example, when the inside of the EUV light concentrating apparatus has a circular shape, the controller may use a circular coordinate system. The controller may precisely measure the position of the tin residue on the inner surface of the EUV light concentrating apparatus by using, as independent parameters, a distance 'd' from a central axis of the inside of the EUV light concentrating apparatus and an azimuth angle $\Theta$ by which the controller rotates about the central axis. The coordinate system that may be used by the controller is not limited to the above-described circular coordinate system and may include various other coordinate systems.

The image of the EUV light reflected on the EUV light concentrating apparatus may be observed at regular intervals and transmitted to the controller. The controller may analyze the transmitted image of the EUV light using the above-described coordinate system and track which part of the inner surface of the EUV light concentrating apparatus is being contaminated. Accordingly, a cleaning process may be concentrated only on a specific part of the inner surface of the EUV light concentrating apparatus.

Figure 15:
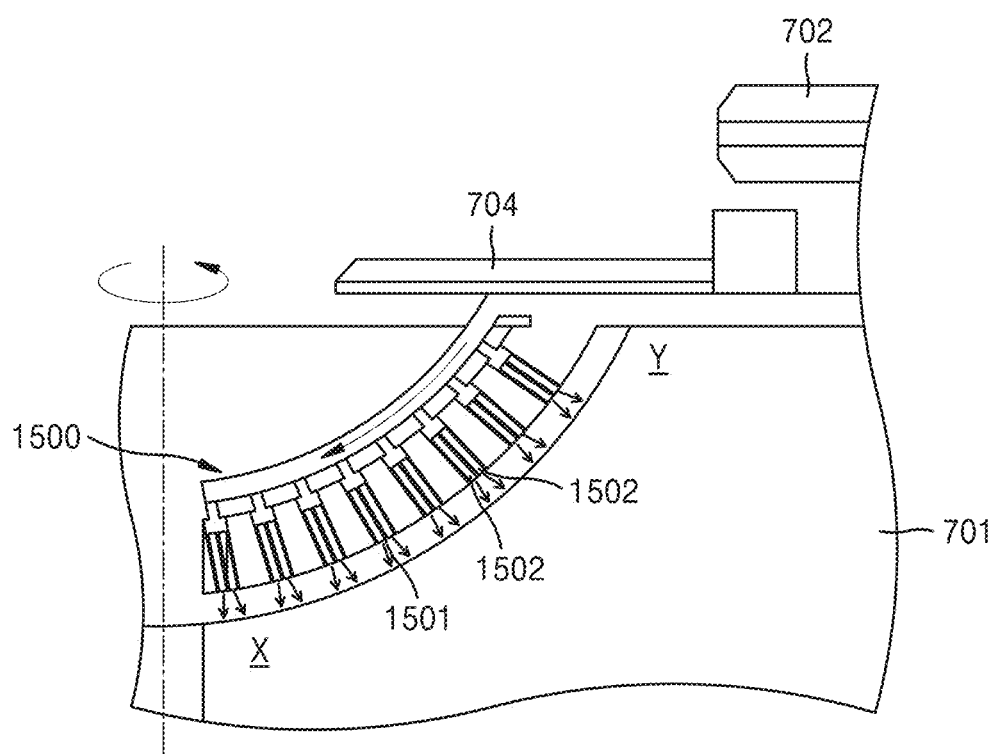
FIG. 15 is an inner cross-sectional view of a nozzle frame according to an example embodiment.
Figure 16:
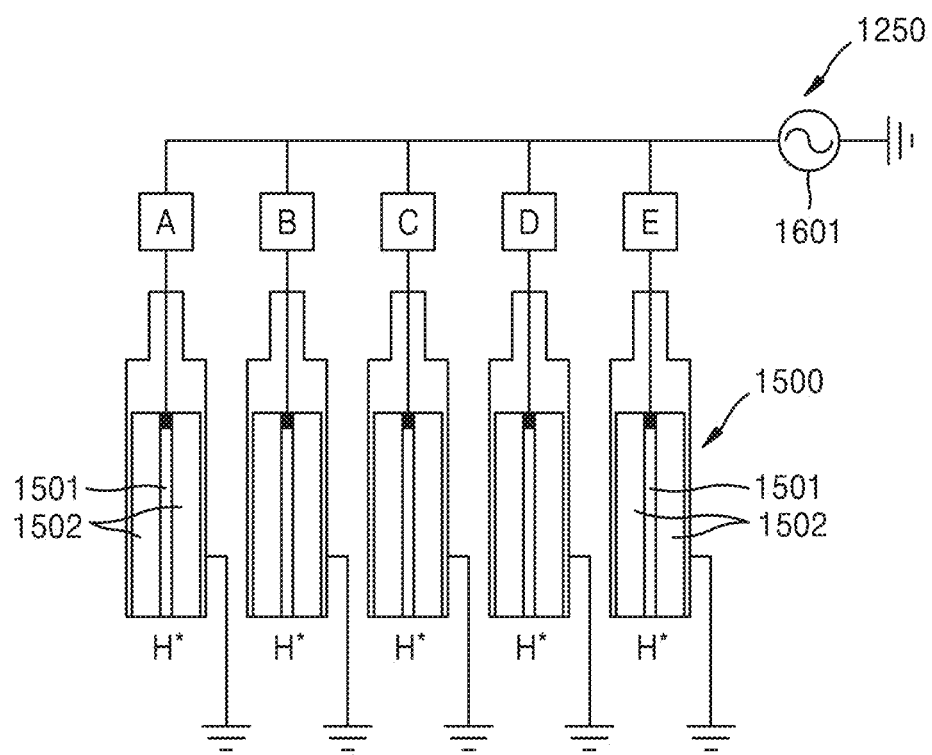
FIG. 16 is a circuit diagram of the nozzle frame shown in FIG. 15, according to an example embodiment.

FIG. 15 is an inner cross-sectional view of a nozzle frame 1500 according to an example embodiment. FIG. 16 is a circuit diagram of the nozzle frame 1500 shown in FIG. 15, according to an example embodiment.

As described above, a main body 701 of an EUV light concentrating apparatus may rotate. Because the main body 701 of the EUV light concentrating apparatus performs a circular motion, a speed of the EUV light concentrating apparatus in a vicinity X of the center of the main body 701 may be different from a speed of the EUV light concentrating apparatus in a vicinity Y of an edge of the main body 701. In other words, the main body 701 of the EUV light concentrating apparatus may rotate at a relatively low rate in the vicinity X of the center of the main body 701 and rotate at a relatively high rate in the vicinity Y of the edge of the main body 701.

Accordingly, concentrations of plasma containing hydrogen radicals to be supplied into the main body 701 of the EUV light concentrating apparatus may also be different depending on locations on the main body 701. In other words, plasma containing a relatively low concentration of hydrogen radicals may be supplied into the vicinity X of the center of the main body 701 of the EUV light concentrating apparatus, and plasma containing a relatively high concentration of hydrogen radicals may be supplied into the vicinity Y of the edge of the main body 701 of the EUV light concentrating apparatus. Hereinafter, a method of supplying plasma containing hydrogen radicals to an inner surface of the main body 701 of the EUV light concentrating apparatus will be described in further detail.

Referring to FIGS. 15 and 16, the nozzle frame 1500 according to the present example embodiment may include a spray unit 1501 and an electrode unit 1502.

A plurality of spray units 1501 and a plurality of electrode units 1502 may be formed at different positions.

The plurality of electrode units 1502 may be electrically connected to an impedance matching network 1250. More specifically, each of the plurality of electrode units 1502 located at the different positions may be electrically connected to the impedance matching network 1250. The impedance matching network 1250 may be electrically connected to a radio-frequency (RF) antenna 1601. Accordingly, a magnitude of a voltage desired by an operator may be provided to each of each of the electrode units 1502 of the nozzle frame 1500. Thus, concentrations of hydrogen radicals respectively generated by the plurality of electrode units 1502 may be controlled differently from each other.

As described above, plasma containing various concentrations of the hydrogen radicals may be formed on the inner surface of the main body 701 of the EUV light concentrating apparatus according to an operator's intention so that contaminants on the inner surface of the main body 701 of the EUV light concentrating apparatus may be effectively removed.

Figure 17:
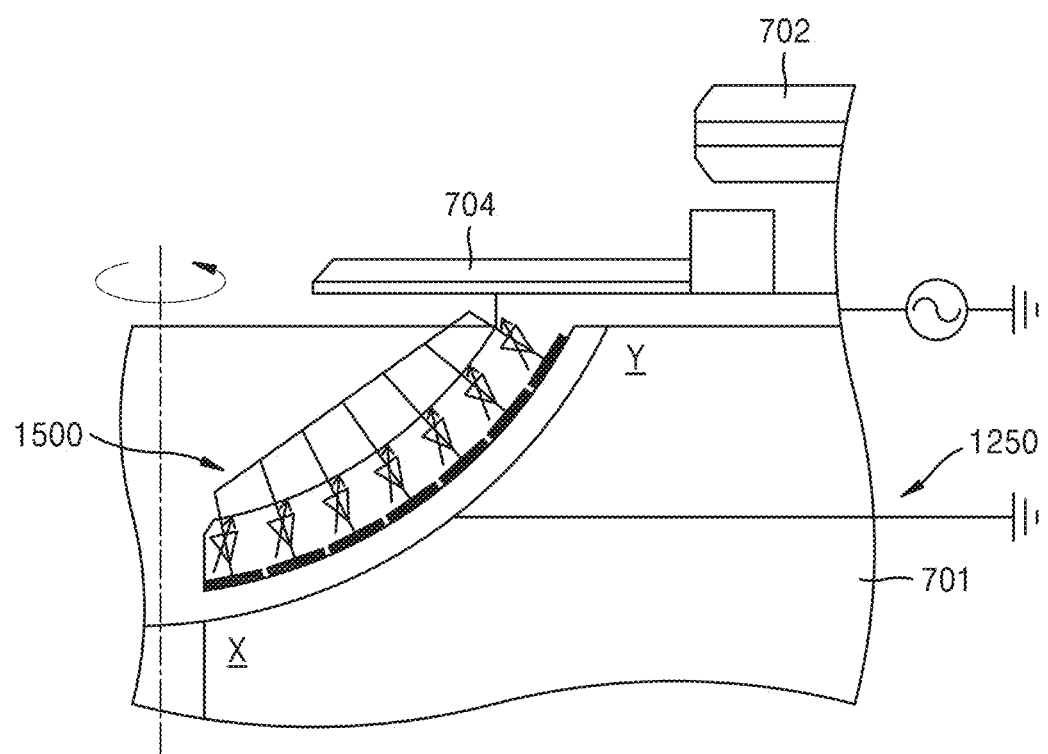
FIG. 17 is a circuit diagram of the nozzle frame shown in FIG. 15, according to an example embodiment.

FIG. 17 is a circuit diagram of the nozzle frame 1500 shown in FIG. 15, according to an example embodiment.

Referring to FIG. 17 (as well as FIG. 16), the electrode units 1502 may be electrically connected to the impedance matching network 1250 and the RF antenna 1601. An inner surface of the main body 701 of the EUV light concentrating apparatus may be grounded. As shown in FIG. 17, when the inner surface of the main body 701 of the EUV light concentrating apparatus is grounded, a plurality of ion particles may be formed in a direction of the electrode units 1502, so damage to the inner surface of the main body 701 of the EUV light concentrating apparatus due to collision of hydrogen radicals with the ion particles may be blocked or prevented.

While the inventive concepts have been particularly shown and described with reference to some example embodiments thereof, it will be understood that various changes in form and details may be made therein without departing from the spirit and scope of the following claims.

What is claimed is:

1. An extreme ultraviolet (EUV) light concentrating apparatus comprising:
    a main body having a concave inner portion;
    a tin generator configured to generate tin drops and spray the tin drops;
    a tin catcher configured to process the sprayed tin drops;
    a protective cover configured to block the tin drops from falling into the main body; and
    a frame under the protective cover, the frame being apart from an inner surface of the main body and being interposed between the protective cover and the main body.

2. The EUV light concentrating apparatus of claim 1, wherein
    an outer shape of the frame comprises a curved surface following a shape of an inner surface of the main body, and
    the EUV light concentrating apparatus is configured to adjust a distance between the frame and the inner surface of the main body.

3. The EUV light concentrating apparatus of claim 1, wherein when the EUV light concentrating apparatus is viewed from above, the protective cover at least partially overlaps the frame.

4. The EUV light concentrating apparatus of claim 1, wherein the frame comprises a spray unit configured to spray gas to the inner surface of the main body.

5. The EUV light concentrating apparatus of claim 1, wherein the frame comprises a suction unit configured to suck contaminants on the inner surface of the main body.

6. The EUV light concentrating apparatus of claim 1, wherein the frame comprises an electrode unit configured to generate plasma near the inner surface of the main body.

7. The EUV light concentrating apparatus of claim 6, wherein
    the frame comprises a plurality of electrode units including the electrode unit, and
    the EUV light concentrating apparatus is configured to individually control the electrode units.

8. The EUV light concentrating apparatus of claim 7, further comprising:
    an impedance matching network electrically connected to the electrode units and the inner surface of the main body, and
    wherein the inner surface of the main body is grounded.

9. A lithography apparatus comprising:
    a source unit configured to emit carbon dioxide laser light;
    an extreme ultraviolet (EUV) light concentrating apparatus configured to expose tin drops to the carbon dioxide laser light, generate EUV light, and concentrate the EUV light; and
    a wing unit configured to provide a path through which the EUV light travels,
    wherein the EUV light concentrating apparatus comprises,
        a main body having a concave inner portion and configured to rotate,
        a tin generator configured to generate the tin drops and spray the tin drops,
        a tin catcher configured to process the sprayed tin drops,
        a protective cover configured to block the tin drops from falling into the main body, and
        a frame under the protective cover, the frame being apart from an inner surface of the main body, and being interposed between the protective cover and the main body.

10. The lithography apparatus of claim 9, wherein
    the wing unit comprises a blocking film configured to block at least part of the carbon dioxide laser.

11. The lithography apparatus of claim 10, wherein when the lithography apparatus is viewed from above, the blocking film, the protective cover, and the frame at least partially overlap each other.

12. The lithography apparatus of claim 10, wherein the frame comprises a spray unit configured to spray gas to the inner surface of the main body.

13. The lithography apparatus of claim 10, wherein the frame comprises a suction unit configured to suck contaminants on the inner surface of the main body.

14. The lithography apparatus of claim 10, wherein
    the frame comprises a plurality of electrode units each configured to generate plasma near the inner surface of the main body,
    wherein the EUV light concentrating apparatus is configured to individually control the plurality of electrode units.

15. The lithography apparatus of claim 10, wherein
    an outer shape of the frame comprises a curved surface following a shape of the inner surface of the main body, and
    the lithography apparatus is further configured to adjust a distance between the frame and the inner surface of the main body.

16. The lithography apparatus of claim 9, further comprising:
a controller connected to the EUV light concentrating apparatus, the controller configured to receive an image of the EUV light, analyze the image using a coordinate system, and track a position of contamination in the EUV light concentrating apparatus.

* * * * *